United States Patent
Lu et al.

(10) Patent No.: US 9,748,152 B2
(45) Date of Patent: *Aug. 29, 2017

(54) SEMICONDUCTOR ARRANGEMENT AND FORMATION THEREOF

(71) Applicant: Taiwan Semiconductor Manufacturing Company Limited, Hsin-Chu (TW)

(72) Inventors: Chih-Lun Lu, New Taipei (TW); Tzu-Chung Wang, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/204,037

(22) Filed: Jul. 7, 2016

(65) Prior Publication Data

US 2016/0322268 A1 Nov. 3, 2016

Related U.S. Application Data

(63) Continuation of application No. 14/613,573, filed on Feb. 4, 2015, now Pat. No. 9,390,985.
(Continued)

(51) Int. Cl.
| | |
|---|---|
| *H01L 21/00* | (2006.01) |
| *H01L 21/66* | (2006.01) |
| *H01L 29/66* | (2006.01) |
| *H01L 21/311* | (2006.01) |
| *H01L 21/3105* | (2006.01) |

(Continued)

(52) U.S. Cl.
CPC .......... *H01L 22/26* (2013.01); *H01L 21/0273* (2013.01); *H01L 21/31055* (2013.01); *H01L 21/31058* (2013.01); *H01L 21/31111* (2013.01); *H01L 21/31133* (2013.01); *H01L 21/31144* (2013.01); *H01L 21/3212* (2013.01); *H01L 21/823437* (2013.01); *H01L 22/12* (2013.01);
(Continued)

(58) Field of Classification Search
CPC ......... H01L 21/31055; H01L 21/31111; H01L 21/31133; H01L 21/0273; H01L 21/3212; H01L 21/823437
See application file for complete search history.

(56) References Cited

U.S. PATENT DOCUMENTS

| | | | |
|---|---|---|---|
| 6,078,487 A | 6/2000 | Partovi et al. | |
| 6,552,372 B2 | 4/2003 | Wu et al. | |

(Continued)

*Primary Examiner* — Trung Q Dang
*Assistant Examiner* — Wasiul Haider
(74) *Attorney, Agent, or Firm* — Cooper Legal Group, LLC

(57) ABSTRACT

Forming a semiconductor arrangement includes non-destructively determining a first spacer height of a first sidewall spacer adjacent a dummy gate and a second spacer height of a second sidewall spacer adjacent the dummy gate based upon a height of a photoresist as measured using optical critical dimension (OCD) spectroscopy. When the photoresist is sufficiently uniform, a hard mask etch is performed to remove a hard mask from the dummy gate and to remove portions of sidewall spacers of the dummy gate. A gate electrode is formed between the first sidewall spacer and the second sidewall spacer to form a substantially uniform gate. Controlling gate formation based upon photoresist height as measured by OCD spectroscopy provides a non-destructive manner of promoting uniformity.

20 Claims, 10 Drawing Sheets

Related U.S. Application Data

(60) Provisional application No. 62/043,586, filed on Aug. 29, 2014.

(51) Int. Cl.
*H01L 21/321* (2006.01)
*H01L 21/8234* (2006.01)
*H01L 21/027* (2006.01)

(52) U.S. Cl.
CPC .......... *H01L 22/20* (2013.01); *H01L 29/6653* (2013.01); *H01L 29/66545* (2013.01)

(56) References Cited

U.S. PATENT DOCUMENTS

| | | |
|---|---|---|
| 7,301,645 B2 | 11/2007 | Wang et al. |
| 7,759,136 B2 | 7/2010 | Hung et al. |
| 2014/0027859 A1* | 1/2014 | Gerhardt ............ H01L 21/28202 257/392 |
| 2014/0092506 A1 | 4/2014 | Ahsan et al. |
| 2014/0264572 A1* | 9/2014 | Kim .................... H01L 21/3083 257/331 |
| 2015/0364326 A1* | 12/2015 | Xie .................... H01L 29/66628 257/288 |

\* cited by examiner

SEMICONDUCTOR ARRANGEMENT AND FORMATION THEREOF

RELATED APPLICATIONS

This application is a continuation of and claims priority to U.S. patent application Ser. No. 14/613,573, titled "SEMICONDUCTOR ARRANGEMENT AND FORMATION THEREOF" and filed on Feb. 4, 2015, which is non-provisional filing of U.S. Provisional Application 62/043,586, titled "SEMICONDUCTOR ARRANGEMENT AND FORMATION THEREOF" and filed on Aug. 29, 2014. U.S. patent application Ser. No. 14/613,573 and U.S. Provisional Application 62/043,586 are incorporated herein by reference.

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
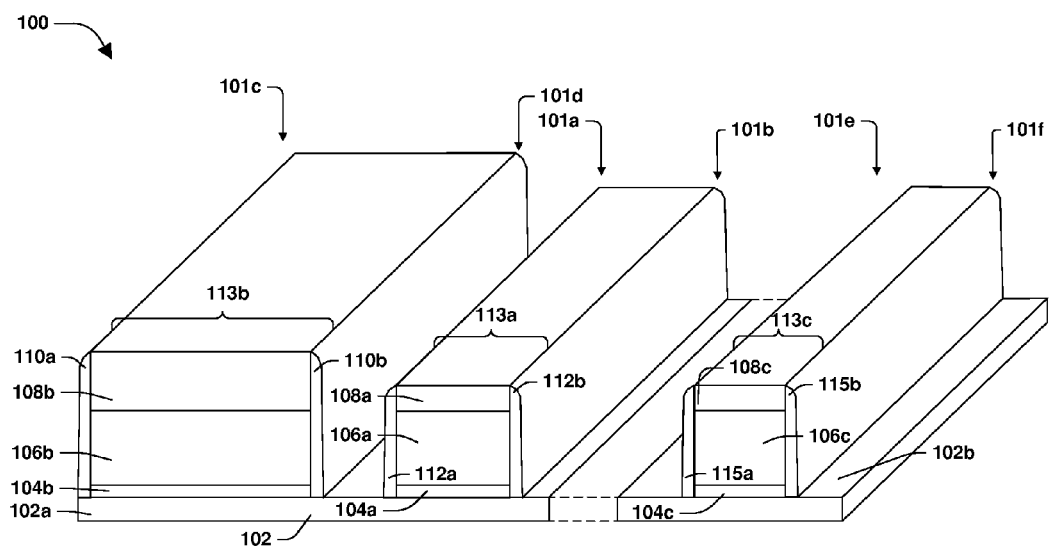
FIG. 1 is an illustration of a semiconductor arrangement at a stage of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein. Some embodiments of the present disclosure have one or a combination of the following features and/or advantages.

According to some embodiments, a method of forming a semiconductor arrangement includes controlling a first gate height of a first gate. In some embodiments, the first gate height of the first gate is controlled by determining a first photoresist height of a first area of a first photoresist adjacent a first dummy gate after a first photoresist etch and determining a second photoresist height of a second area of a first photoresist adjacent the first dummy gate after the first photoresist etch. In some embodiments, at least one of the first photoresist height or the second photoresist height is determined by performing optical critical dimension (OCD) spectroscopy. In some embodiments, at least one of the first photoresist height or the second photoresist height is determined by generating a three-dimensional (3D) model using OCD spectroscopy data.

In some embodiments, responsive to the first photoresist height and the second photoresist height having a first difference that is less than a first threshold difference, a hard mask etch is performed. In some embodiments, the first threshold difference comprises a first height range, such that the first photoresist height and the second photoresist height fall within the first height range. In some embodiments, the first threshold difference is between about 1.0 nm to about 4.0 nm. It will be appreciated that unclaimed ranges, values, etc. provided herein are, in some embodiments, merely examples and are not intended to limit the scope of the claimed subject matter. According to some embodiments, the hard mask etch removes a first hard mask of the first dummy gate. In some embodiments, the hard mask etch removes a portion of a first sidewall spacer above the first photoresist and a portion of a second sidewall spacer above the first photoresist. In some embodiments, a first spacer height of the first sidewall spacer is correlated to a mean of the first photoresist height and the second photoresist height. In some embodiments, a second spacer height of the second sidewall spacer is correlated to the mean of the first photoresist height and the second photoresist height.

According to some embodiments, responsive to the first difference between the first photoresist height and the second photoresist height being greater than the first threshold difference, the first photoresist is removed and a second layer of photoresist is formed over the substrate and the first dummy gate. In some embodiments, a second photoresist etch is performed to pattern the second layer of photoresist to form a second photoresist adjacent the first dummy gate. In some embodiments, the second photoresist etch is automatically altered, such that the second photoresist etch is different than the first photoresist etch based on the first difference between the first photoresist height and the second photoresist height. In some embodiments, performing the second photoresist etch comprises adjusting at least one of a temperature, a pressure, a chemistry, a concentration, or a duration of the second photoresist etch relative to the first photoresist etch. In some embodiments, a third photoresist height of a third area of the second photoresist is determined after the second photoresist etch. In some embodiments, a fourth photoresist height of a fourth area of the second photoresist is determined after the second photoresist etch. In some embodiments, a second difference between the third photoresist height and the fourth photoresist height is determined.

According to some embodiments, responsive to the second difference between the third photoresist height and the fourth photoresist height being less than the first threshold difference, the hard mask etch is performed. In some embodiments, the hard mask etch removes a portion of the first sidewall spacer above the second photoresist and a portion of the second sidewall spacer above the second photoresist. In some embodiments, the first spacer height of the first sidewall spacer is correlated to a mean of the third photoresist height and the fourth photoresist height. In some embodiments, the second spacer height of the second sidewall spacer is correlated to the mean of the first photoresist height and the second photoresist height.

In some embodiments, a first dummy material of the first dummy gate is removed from between the first sidewall spacer and the second sidewall spacer, after the hard mask etch. In some embodiments, the first gate is formed by forming a first gate electrode between the first sidewall spacer and the second sidewall spacer, where a first gate height of the first gate is correlated to at least one of the first spacer height or the second spacer height. Given that the first gate is not formed until measured heights of a photoresist are sufficiently similar or fall within a difference threshold and given that the height of the first gate is correlated to or a function of the height or thickness of the photoresist, the gate has a substantially uniform height, or at least a height within a uniformity tolerance. In some embodiments, controlling the first photoresist height and the second photoresist height, relative to the first dummy gate, such as when the first dummy gate comprises one or more different profiles as compared to a second dummy gate adjacent the first dummy gate, controls the first gate height of the first gate. In some embodiments, OCD spectroscopy is a non-invasive or non-destructive technique for determining a height of a photoresist. In some embodiments, using a non-invasive or non-destructive technique to monitor photoresist height and control gate height formation to produce a substantially uniform gate increases yield and production speed of a fabrication process for the semiconductor arrangement and allows in line monitoring as compared to a gate height that is measured using invasive or destructive means.

FIGS. 1-10 are perspective views of a semiconductor arrangement 100, according to some embodiments, at various stages of fabrication. Turning to FIG. 1, a first dummy gate 113a is over a substrate 102, according to some embodiments. In some embodiments, a second dummy gate 113b is adjacent the first dummy gate 113a over the substrate 102. In some embodiments, a third dummy gate 113c is adjacent the second dummy gate 113b over the substrate 102. In some embodiments, the substrate 102 includes at least one of an epitaxial layer, a silicon-on-insulator (SOI) structure, a wafer, or a die formed from a wafer. In some embodiments, the substrate 102 comprises at least one of silicon, carbon, etc. In some embodiments, the substrate 102 is illustrated using dashed lines. In some embodiments, the dashed lines indicate a distance between a first portion 102a of the substrate 102 and a second portion 102b of the substrate 102, where the distance ranges between about 1 nm to about 1 mm. In some embodiments, the third dummy gate 113c is the distance away from the first dummy gate. In some embodiments, one or more dummy gates are over the second portion 102b of the substrate 102. In some embodiments, the second portion 102b corresponds to at least one of a pad, inactive or peripheral portion of a wafer, die on a wafer, etc. In some embodiments, the substrate 102 comprises at least one of a first channel under the first dummy gate 113a, or a second channel under the second dummy gate 113b. In some embodiments, the substrate 102 comprises at least one of a source or a drain adjacent at least one of the first dummy gate 113a, or the second dummy gate 113b.

In some embodiments, the first dummy gate 113a comprises a first hard mask 108a over a first dummy material 106a, with the first dummy material 106a over a first gate dielectric layer 104a. In some embodiments, the first gate dielectric layer 104a is in contact with the substrate 102. In some embodiments, a first sidewall spacer 112a is on a first side 101a of the first dummy gate 113a. In some embodiments, a second sidewall spacer 112b is on a second side 101b of the first dummy gate 113a. In some embodiments, the second dummy gate 113b comprises a second hard mask 108b over a second dummy material 106b, with the second dummy material 106b over a second gate dielectric layer 104b. In some embodiments, the second gate dielectric layer 104b is in contact with the substrate 102. In some embodiments, a third sidewall spacer 110a is on a first side 101c of the second dummy gate 113b. In some embodiments, a fourth sidewall spacer 110b is on a second side 101d of the second dummy gate 113b. In some embodiments, the third dummy gate 113c comprises a third hard mask 108c over a third dummy material 106c, with the third dummy material 106c over a third gate dielectric layer 104c. In some embodiments, the third gate dielectric layer 104c is in contact with the substrate 102. In some embodiments, a fifth sidewall spacer 115a is on a first side 101e of the third dummy gate 113c. In some embodiments, a sixth sidewall spacer 115b is on a second side 101f of the third dummy gate 113c.

In some embodiments, at least one of the first gate dielectric layer 104a, the second gate dielectric layer 104b, or the third gate dielectric layer 104c comprises a low dielectric constant material, such as at least one of oxide, nitride, etc. In some embodiments, at least one of the first dummy material 106a, the second dummy material 106b, or the third dummy material 106c comprises at least one of polysilicon, an inert material, etc. In some embodiments, at least one of the first hard mask 108a, the second hard mask 108b, or the third hard mask 108c comprises nitride. In some embodiments, at least one of the first sidewall spacer 112a, the second sidewall spacer 112b, the third sidewall spacer 110a, the fourth sidewall spacer 110b, the fifth sidewall spacer 115a, or the sixth sidewall spacer 115b comprises nitride.

Figure 2:
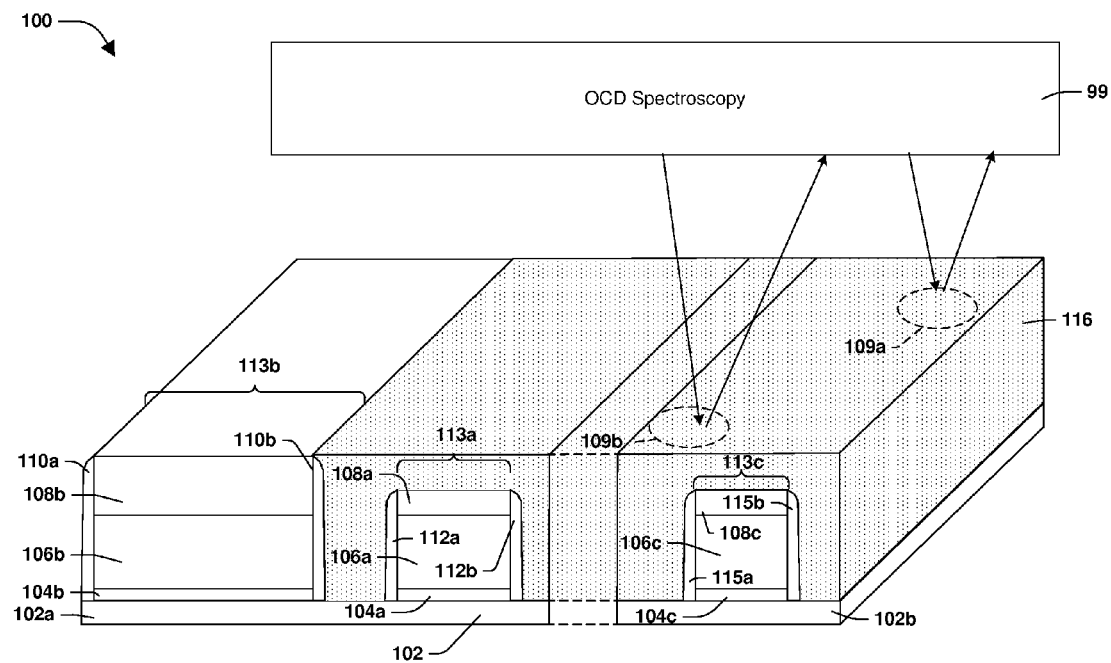
FIG. 2 is an illustration of a semiconductor arrangement at a stage of fabrication, in accordance with some embodiments.

Turning to FIG. 2, a first layer of photoresist 116 is formed over at least one of the first dummy gate 113a, the second dummy gate 113b, or the third dummy gate 113c and over exposed portions of the substrate 102, according to some embodiments. In some embodiments, the first layer of photoresist 116 is formed by growth or deposition. In some embodiments, the first layer of photoresist 116 is formed by at least one of spin on coating, atomic layer deposition (ALD), chemical vapor deposition (CVD), or physical vapor deposition (PVD). In some embodiments, chemical mechanical planarization (CMP) is performed to make a top surface of the first layer of photoresist 116 more uniform. In some embodiments, the CMP exposes the second hard mask 108b. In some embodiments, the first layer of photoresist 116 is illustrated using dashed lines. In some embodiments, the dashed lines indicate the distance between a first portion of the first layer of photoresist 116 over the first portion 102a of the substrate and a second portion of the first layer of photoresist 116 over the second portion 102b of the substrate, where the distance ranges between about 1 nm to about 1 mm.

In some embodiments, optical critical dimension (OCD) spectroscopy is performed by an OCD spectroscopy component 99 on at least one of a first baseline area 109a or a second baseline area 109b to generate a first OCD baseline after the first layer of photoresist 116 is formed. In some embodiments, as many as 50 baseline areas, or more, are measured to generate the first OCD baseline. In some embodiments, the baseline areas are chosen at random. In some embodiments, the baseline areas of the first layer of photoresist 116 are over the second portion 102b of the substrate 102. In some embodiments, the baseline areas of the first layer of photoresist 116 are over the second portion 102b of the substrate 102 and adjacent the third dummy gate 113c. In some embodiments, the baseline areas of the first layer of photoresist 116 are over the second portion 102b of the substrate 102 and the first portion 102a of the substrate 102. In some embodiments, the baseline areas are used to determine one or more initial heights of at least one of the first baseline area 109a, the second baseline area 109b, or one or more other areas of the first layer of photoresist 116. In some embodiments, responsive to a difference between at least some of the one or more initial heights being greater than an initial threshold difference, the first layer of photoresist 116 may be removed and a different layer of photoresist may be formed. In some embodiments, the initial threshold difference is between about 15 nm to about 25 nm. In some embodiments, a mean of the initial heights is determined based upon at least some of the one or more initial heights. In some embodiments, if the mean of the initial heights is less than or greater than a target height, the first layer of photoresist 116 may be removed and a different layer of photoresist may be formed. In some embodiments, the target height is between about 160 nm to about 200 nm.

Figure 3:
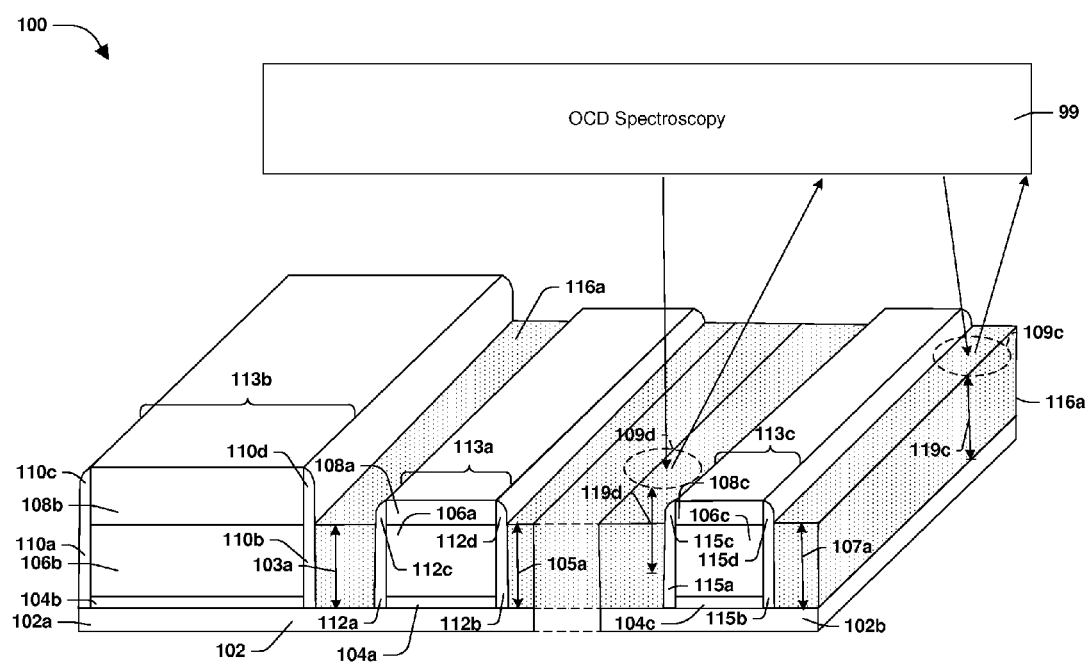
FIG. 3 is an illustration of a semiconductor arrangement at a stage of fabrication, in accordance with some embodiments.

Turning to FIG. 3, a first photoresist etch is performed to form a first photoresist 116a adjacent the first dummy gate 113a, according to some embodiments. According to some embodiments, OCD spectroscopy is performed by the OCD spectroscopy component 99 to generate a first OCD reading. In some embodiments, the first OCD reading and the first OCD baseline are combined to generate primary OCD data.

In some embodiments, the primary OCD data is used to generate a first 3D model of at least one of a first area 109c of the first photoresist 116a, or a second area 109d of the first photoresist 116a. In some embodiments, as many as 50 additional areas, or more, are measured to generate the first 3D model. In some embodiments, the areas are chosen at random. In some embodiments, the areas of the first photoresist 116a are over the second portion 102b of the substrate 102. In some embodiments, the areas are over the second portion 102b of the substrate 102 and adjacent the third dummy gate 113c. In some embodiments, the additional areas of the first photoresist 116a are over the second portion 102b of the substrate 102 and the first portion 102a of the substrate 102.

According to some embodiments, the first 3D model includes a first photoresist height 119c of the first area 109c of the first photoresist 116a and a second photoresist height 119d of the second area 109d of the first photoresist 116a. In some embodiments, the first 3D model includes additional heights of the additional areas of the first photoresist. In some embodiments, a mean height 107a is determined by calculating a mean of heights of at least one of the first area 109c, the second area 109d, the additional areas, etc. According to some embodiments, at least one of the first photoresist height 119c, the second photoresist height 119d, or the additional heights are measured from a top surface of the first photoresist 116a to a top surface of the substrate 102. Depending on uniformity of the first photoresist 116a, a first portion height 103a of a first portion of the first photoresist 116a between the first dummy gate 113a and the second dummy gate 113b may or may not correspond to the mean height 107a. Depending on uniformity of the first photoresist 116a, a second portion height 105a of a second portion of the first photoresist 116a opposite the first portion of the first photoresist 116a across the first dummy gate 113a may or may not correspond to the mean height 107a.

According to some embodiments, a first difference between the first photoresist height 119c and the second photoresist height 119d is determined and compared to a first threshold difference. In some embodiments, the first threshold difference is between about 1.0 nm to about 4.0 nm. In some embodiments, the first threshold difference is related to a first height range. In some embodiments, the first height range is between about 10 nm to about 30 nm. For example, if the first photoresist height is 23 nm and the second photoresist height is 25 nm, the first photoresist height and the second photoresist height fall within the first height range, and have a height difference less than the first threshold difference. In some embodiments, such as when the additional heights are included in the first 3D model, the additional heights are compared to the first threshold difference in a same manner as the first photoresist height 119c and the second photoresist height 119d.

Figure 4:
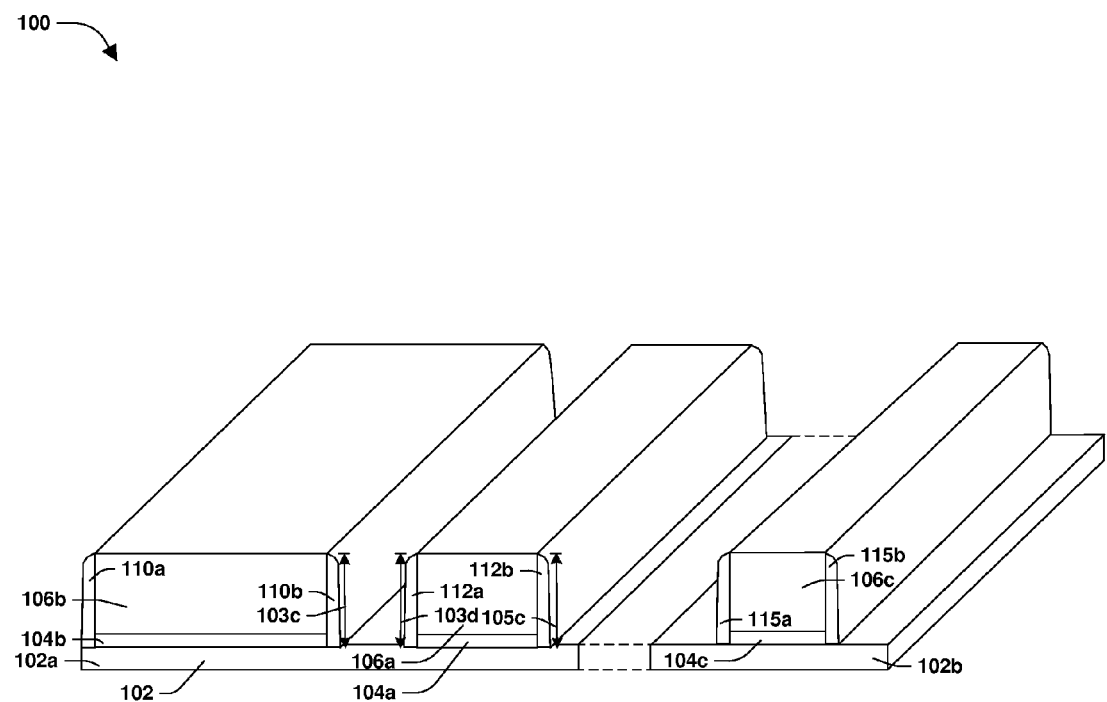
FIG. 4 is an illustration of a semiconductor arrangement at a stage of fabrication, in accordance with some embodiments.

According to some embodiments, responsive to the first difference between at least one of the first photoresist height 119c, the second photoresist height 119d, or one or more of the additional heights being less than the first threshold difference, meaning that the first photoresist 116a is sufficiently uniform, a hard mask etch is performed. As illustrated in FIG. 4, the hard mask etch removes at least one of the first hard mask 108a, the second hard mask 108b, or the third hard mask 108c, according to some embodiments.

With reference to FIG. 3 and FIG. 4, the hard mask etch removes a portion 112c of the first sidewalls spacer 112a above the first portion of the first photoresist 116a and a portion 112d of the second sidewall spacer 112b above the second portion of the first photoresist 116a. In some embodiment, the hard mask etch removes a portion 110c of the third sidewalls spacer 110a and a portion 110d of the fourth sidewall spacer 110b above the first photoresist 116a. In some embodiment, the hard mask etch removes a portion 115c of the fifth sidewalls spacer 115a and a portion 115d of the sixth sidewall spacer 115b above the first photoresist 116a. In some embodiment, the hard mask etch is selective for the first hard mask 108a, the second hard mask 108b, the third hard mask 108c, the first sidewall spacer 112a, the second sidewall spacer 112b, the third sidewall spacer 110a, the fourth sidewall spacer 110b, the fifth sidewall spacer 115a, and the sixth sidewall spacer 115b, such that the hard mask etch removes little to none of the first photoresist 116a, the first dummy material 106a, the second dummy material 106b, and the third dummy material 106c. In some embodiment, the hard mask etch comprises a plasma etch. In some embodiments, prior to the hard mask etch, an $O_2$ plasma clean is performed, to smooth the first photoresist 116a.

According to some embodiments, after the hard mask etch, a first spacer height 103d of the first sidewall spacer 112a is correlated to the first portion height 103a, and a second spacer height 105c of the second sidewall spacer 112b is correlated to the second portion height 105a. In some embodiments, the correlation comprises a linear correlation consistent with equation (1) below.

$$y=mx+b \quad (1)$$

In equation (1) above, y is equal to a spacer height, such as at least one of the first spacer height 103d or the second spacer height 105c, m is equal to a first constant, x is equal to a photoresist portion height, such as at least one of the first portion height 103a or the second portion height 105a, and b is equal to second constant. In some embodiments, after the hard mask etch, a fourth spacer height 103c of the fourth sidewall spacer 110b is correlated, in accordance with equation (1) above, to the first portion height 103a. In some embodiments, a third photoresist etch is performed to remove the first photoresist 116a. In some embodiments, the third photoresist etch is performed after the hard mask etch.

Figure 5:
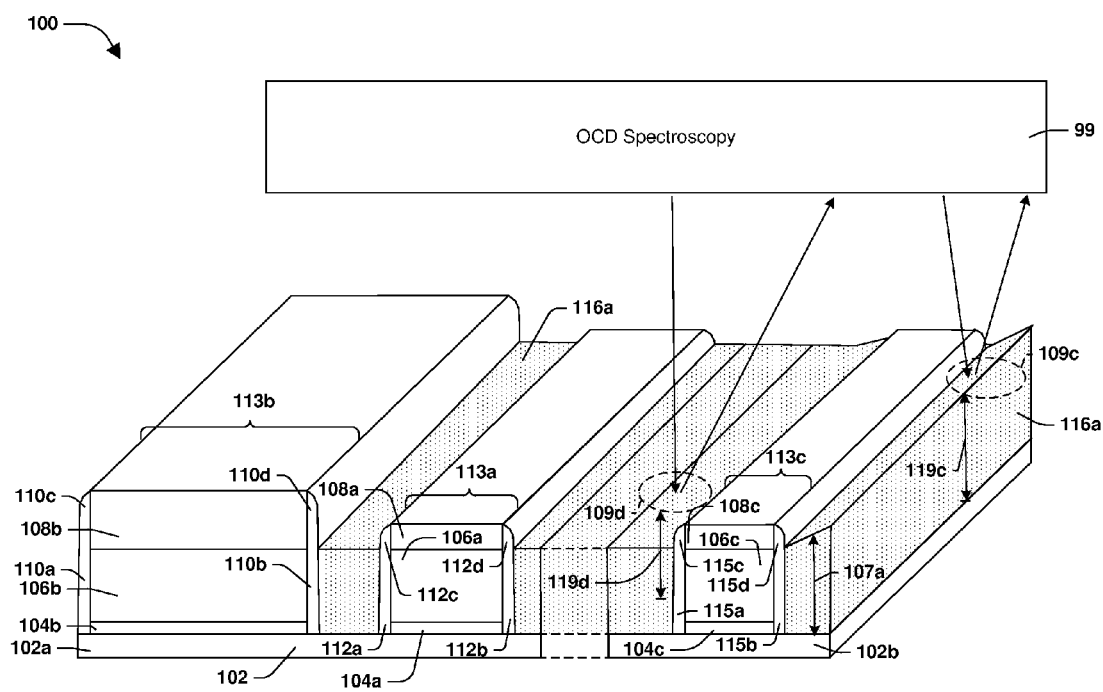
FIG. 5 is an illustration of a semiconductor arrangement at a stage of fabrication, in accordance with some embodiments.

Turning to FIG. 5, the semiconductor arrangement 100 is illustrated where undesired photoresist deviations exist, such as determined based upon OCD data from the OCD spectroscopy component 99. In FIG. 5, the first difference between the first photoresist height 119c and the second photoresist height 119d does not fall within the first threshold difference. For example, the first photoresist 116a is non-uniform or uneven, such that the first photoresist height 119c of the first area 109c of the first photoresist 116a is markedly greater than the second photoresist height 119d of the second area 109d of the first photoresist 116a. For example, where the first threshold difference is between about 1.0 nm to about 4.0 nm, the difference between the first photoresist height 119c and the second photoresist height 119d is greater than 5.0 nm. Additionally or alternatively, where the first threshold difference relates to a first height range, at least one of the first photoresist height 119c or the second photoresist height 119d falls outside of the first height range, according to some embodiments. For example, where the first height range is between about 10 nm to about 30 nm, at least one of the first photoresist height 119c or the second photoresist height 119d is less than 10 nm or greater than 30 nm.

Figure 6:
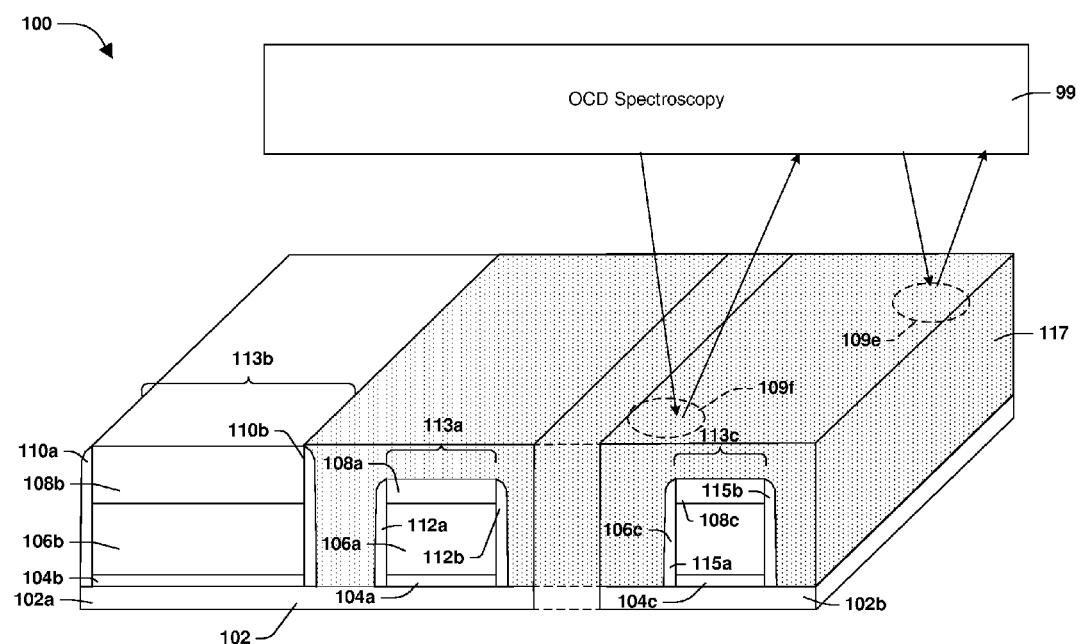
FIG. 6 is an illustration of a semiconductor arrangement at a stage of fabrication, in accordance with some embodiments.

Turning to FIG. 6, responsive to the first difference between the first photoresist height 119c and the second photoresist height 119d being greater than the first threshold difference, the first photoresist 116a is removed and a second layer of photoresist 117 is formed over, the first dummy gate 113a, the second dummy gate 113b, and the third dummy gate 113c, according to some embodiments. In some embodiments, the second layer of photoresist 117 is formed by growth or deposition. In some embodiments, the second layer of photoresist 117 is formed by at least one of spin on coating, ALD, CVD, or PVD. In some embodiments, CMP is performed to make a top surface of the second layer of photoresist 117 more uniform. In some embodiments, the CMP exposes the second hard mask 108b. In some embodiments, OCD spectroscopy is performed on at least one of a third baseline area 109e or a fourth baseline area 109f by the OCD spectroscopy component 99 to generate a second OCD baseline after the second layer of photoresist 117 is formed. In some embodiments, the second OCD baseline is generated in a same manner as described above with regard to generating the first OCD baseline as illustrated in FIG. 2.

Figure 7:
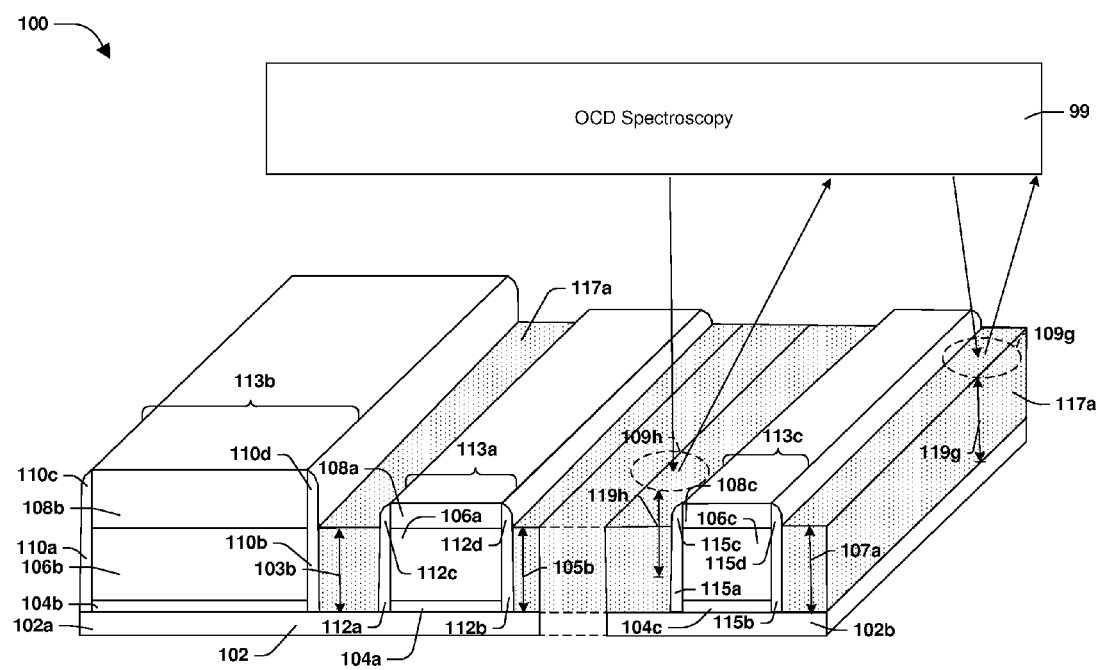
FIG. 7 is an illustration of a semiconductor arrangement at a stage of fabrication, in accordance with some embodiments.

Turning to FIG. 7, a second photoresist etch is performed to form a second photoresist 117a in a similar manner as described above with regard to the first photoresist 116a, as illustrated in FIG. 3. In some embodiments, the second photoresist etch is automatically adjusted, such that at least one of a temperature, a pressure, a chemistry, a concentration, or a duration of the second photoresist etch is different relative to the first photoresist etch. In some embodiment, the second photoresist etch is adjusted based upon a degree to which the first difference deviates from the first threshold difference.

According some embodiments, OCD spectroscopy is performed by the OCD spectroscopy component 99 to generate a second OCD reading. In some embodiments, the second OCD reading and the second OCD baseline are combined to generate secondary OCD data. In some embodiments, the secondary OCD data is used to generate a second 3D model that includes a third photoresist height 119g of a third area 109g of the second photoresist 117a and a fourth photoresist height 119h of a fourth area 109h of the second photoresist 117a. In some embodiments, the second 3D model includes additional heights of additional areas of the second photoresist 117a. In some embodiments, a mean height 107b is determined by calculating a mean of heights of at least one of the third area 109g, the fourth area 109h, the additional areas, etc. According to some embodiments, at least one of the third photoresist height 119g, the fourth photoresist height 119h, or the additional heights are measured from a top surface of the second photoresist 117a to the top surface of the substrate 102. Depending on uniformity of the second photoresist 117a, a first portion height 103b of a first portion of the second photoresist 117a between the first dummy gate 113a and the second dummy gate 113b may or may not correspond to the mean height 107b. Depending on uniformity of the second photoresist 117a, a second portion height 105b of a second portion of the second photoresist 117a opposite the first portion of the second photoresist 117a across the first dummy gate 113a may or may not correspond to the mean height 107b. In some embodiments, at least one of the third photoresist height 119g, the fourth photoresist height 119h, or one or more of the additional heights are compared to a second difference in a similar manner as described above with regard to the first 3D model and the first difference, as illustrated in FIG. 3.

Figure 8:
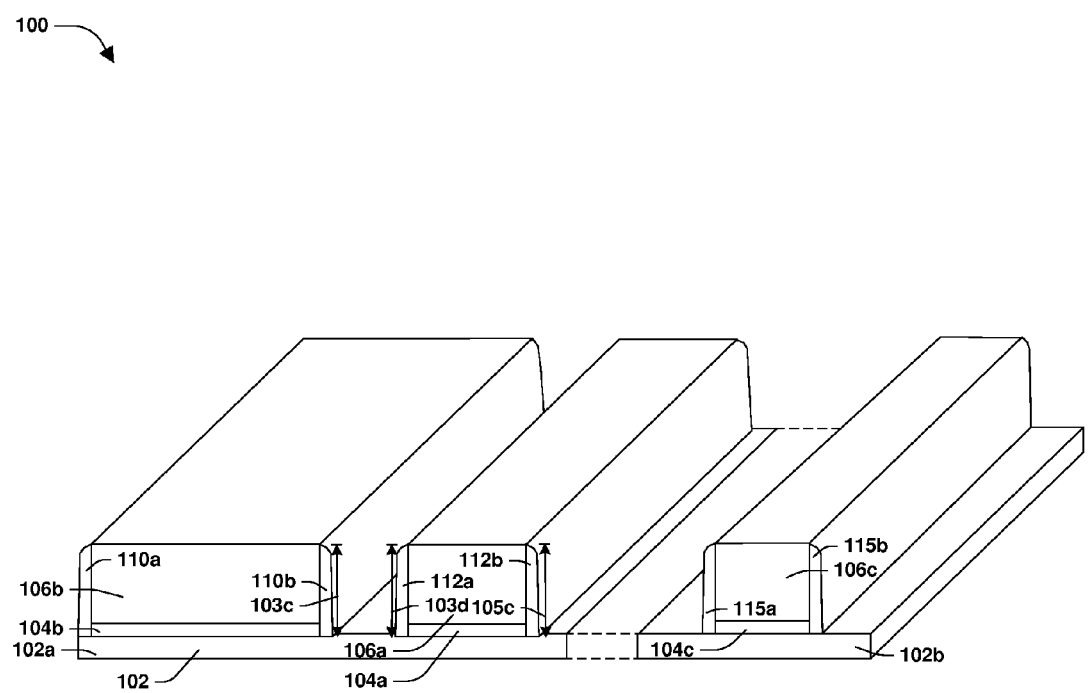
FIG. 8 is an illustration of a semiconductor arrangement at a stage of fabrication, in accordance with some embodiments.

Turning to FIG. 8, responsive to the second difference between at least one of the third photoresist height 119g, the fourth photoresist height 119h, or one or more of the additional heights being less than the first threshold difference, meaning that the second photoresist 117a is sufficiently uniform, the hard mask etch is performed, according to some embodiments. In some embodiments, the hard mask etch is performed as described above with regard to the hard mask etch, as illustrated in FIG. 3 and FIG. 4.

In some embodiments, prior to the hard mask etch, the O₂ plasma clean is performed, to smooth the second photoresist 117a. In some embodiments, the third photoresist etch is performed in a similar manner as described above with regard to the third photoresist etch, as illustrated in FIG. 3 and FIG. 4. In some embodiments, FIG. 8 is substantially the same as FIG. 4 despite the formation of the second layer of photoresist 117 for FIG. 8 but not for FIG. 4. Where undesired photoresist deviations exist/persist, after a removal of subsequent photoresists, an application of one or more additional layers of photoresist is contemplated to ultimately achieve an arrangement as described with respect to FIG. 4 or FIG. 8. Application of such additional layers of photoresist is within the scope of various embodiments.

Figure 9:
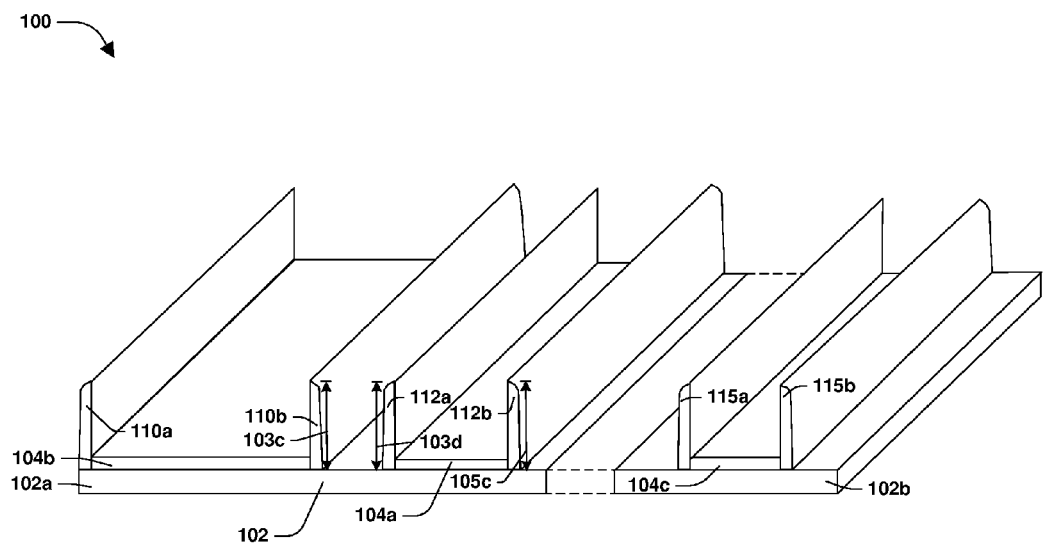
FIG. 9 is an illustration of a semiconductor arrangement at a stage of fabrication, in accordance with some embodiments.

Turning to FIG. 9, after the third photoresist etch, leading to the arrangement in FIG. 4 or FIG. 8, at least one of the first dummy material 106a is removed from between the first sidewall spacer 112a and the second sidewall spacer 112b, the second dummy material 106b is removed from between the third sidewall spacer 110a and the fourth sidewall spacer 110b, or the third dummy material 106c is removed from between the fifth sidewall spacer 115a and the sixth sidewall spacer 115b, according to some embodiment. In some embodiments, at least one of the first dummy material 106a, the second dummy material 106b, or the third dummy material 106c is removed by etching. In some embodiments, CMP is performed on at least one of the first dummy material 106a, the first sidewall spacer 112a, the second sidewall spacer 112b, the second dummy material 106b, the third sidewall spacer 110a, the fourth sidewall spacer 110b, the third dummy material 106c, the fifth sidewall spacer 115a, or the sixth sidewall spacer 115b before removing at least one of the first dummy material 106a, the second dummy material 106b, or the third dummy material 106c.

Figure 10:
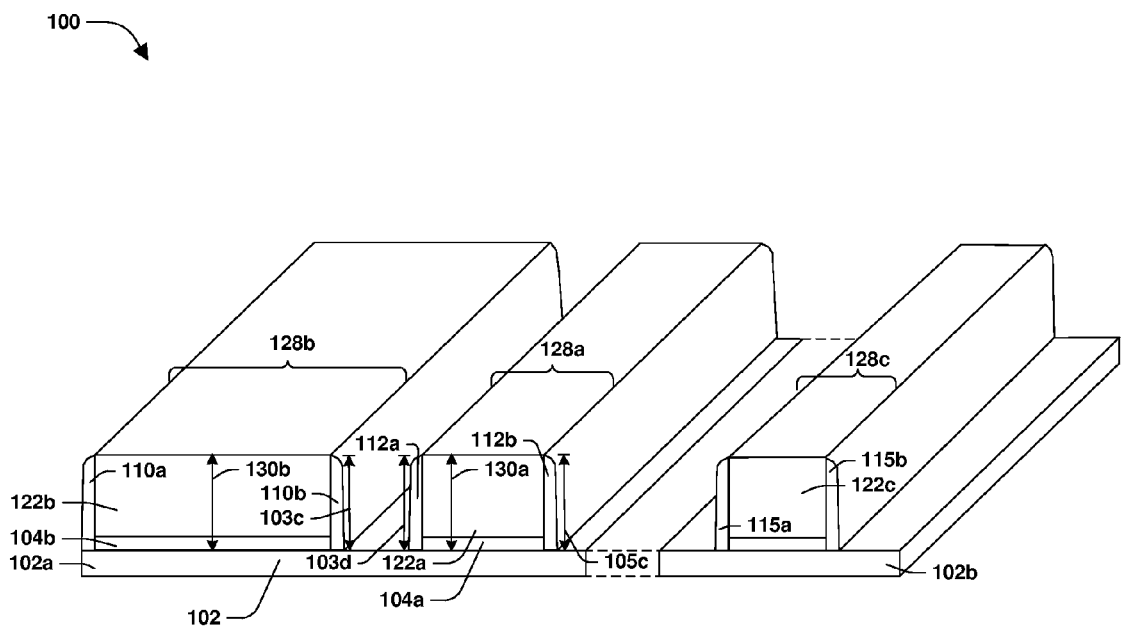
FIG. 10 is an illustration of a semiconductor arrangement at a stage of fabrication, in accordance with some embodiments.

Turning to FIG. 10, a first gate electrode 122a is formed between the first sidewall spacer 112a and the second sidewall spacer 112b to form a first gate 128a, according to some embodiments. In some embodiments, a second gate electrode 122b is formed between the third sidewall spacer 110a and the fourth sidewall spacer 110b to form a second gate 128b. In some embodiments, a third gate electrode 122c is formed between the fifth sidewall spacer 115a and the sixth sidewall spacer 115b to form a third gate 128c. In some embodiment, at least one of the first gate electrode 122a, the second gate electrode 122b, or the third gate electrode 122c comprises a conductive material. In some embodiments, the conductive material comprises at least one of metal, metalloid, etc. In some embodiment, at least one of the first gate electrode 122a, the second gate electrode 122b, or the third gate electrode 122c is formed by at least one of growth or deposition. In some embodiment, at least one of the first gate electrode 122a, the second gate electrode 122b, or the third gate electrode 122c is formed by at least one of PVD, ALD, or CVD. In some embodiments, the third gate 128c is not a functional gate.

In some embodiments, the first gate 128a comprises the first gate electrode 122a and the first gate dielectric layer 104a. In some embodiments, the second gate 128b comprises the second gate electrode 122b and the second gate dielectric layer 104b. In some embodiments, the third gate 128c comprises the third gate electrode 122c and the third gate dielectric layer 104c. In some embodiments, a first gate height 130a of the first gate 128a is correlated to at least one of the first spacer height 103d or the second spacer height 105c. In some embodiments, a second gate height 130b of the second gate 128b is correlated to at least one of the third spacer height or the fourth spacer height 103c. In some embodiments, controlling the first photoresist height or the second photoresist height of the first photoresist, relative to the first dummy gate, controls the first gate height of the first gate.

In some embodiments, OCD spectroscopy is a substantially non-invasive or non-destructive technique for determining a height of a photoresist. In some embodiments, the first spacer height 103d is controlled by controlling the first photoresist height and the second spacer height 105c is controlled by controlling the second photoresist height. In some embodiments, controlling the first spacer height 103d and the second spacer height 105c controls the first gate height 130a. In some embodiments, controlling the first gate height 130a without using invasive or destructive monitoring techniques increases yield and speed of a fabrication process for the semiconductor arrangement 100 and allows in line monitoring as compared to techniques that monitor photoresist height and control gate height in a destructive manner.

According to some embodiments, a method of forming a semiconductor arrangement comprises determining a first photoresist height of a first area of a first photoresist adjacent a first dummy gate after a first photoresist etch and determining a second photoresist height of a second area of the first photoresist after the first photoresist etch. According to some embodiments, the method of forming a semiconductor arrangement comprises responsive to a first difference between the first photoresist height and the second photoresist height being less than a first threshold difference, performing a hard mask etch, where the hard mask etch removes a first hard mask of the first dummy gate, a portion of a first sidewall spacer above the first photoresist and a portion of a second sidewall spacer above the first photoresist, such that a first spacer height of the first sidewall spacer is correlated to a mean of the first photoresist height and the second photoresist height and a second spacer height of the second sidewall spacer is correlated to the mean of the first photoresist height and the second photoresist height. According to some embodiments, the method of forming a semiconductor arrangement comprises removing a first dummy material of the first dummy gate from between the first sidewall spacer and the second sidewall spacer and forming a first gate by forming a first gate electrode between the first sidewall spacer and the second sidewall spacer, where a first gate height of the first gate is correlated to at least one of the first spacer height or the second spacer height.

According to some embodiments, a method of forming a semiconductor arrangement comprises determining a first photoresist height of a first area of a first photoresist adjacent a first dummy gate after a first photoresist etch and determining a second photoresist height of a second area of the first photoresist after a first photoresist etch. According to some embodiments, the method of forming a semiconductor arrangement comprises at least one of responsive to a first difference between the first photoresist height and the second photoresist height being less than a first threshold difference, performing a hard mask etch, where the hard mask etch removes a first hard mask of the first dummy gate, a portion of a first sidewall spacer above the first photoresist and a portion of a second sidewall spacer above the first photoresist, where a first spacer height of the first sidewall spacer is correlated to a mean of the first photoresist height and the second photoresist height and a second spacer height of the second sidewall spacer is correlated to the mean of the first photoresist height and the second photoresist height, or responsive to the first difference being greater than the first threshold difference removing the first photoresist and forming a second layer of photoresist over the first dummy gate. According to some embodiments, the method of forming a semiconductor arrangement comprises performing a second photoresist etch to pattern the second layer of photoresist to form a second photoresist adjacent the first dummy gate, where the second photoresist etch is different than the first photoresist etch based upon the first difference between the first photoresist height and the second photoresist height. According to some embodiments, the method of forming a semiconductor arrangement comprises determining a third photoresist height of a third area of the second photoresist adjacent the first dummy gate after the second photoresist etch and determining a fourth photoresist height of a fourth area of the second photoresist after the second photoresist etch. According to some embodiments, the method of forming a semiconductor arrangement comprises responsive to a second difference between the third photoresist height and the fourth photoresist height being less than the first threshold difference, performing the hard mask etch, where the hard mask etch removes the first hard mask of the first dummy gate, a portion of the first sidewall spacer above the second photoresist and a portion of the second sidewall spacer above the second photoresist, such that the first spacer height of the first sidewall spacer is correlated to a mean of the third photoresist height and the fourth photoresist height and the second spacer height of the second sidewall spacer is correlated to the mean of the third photoresist height and the fourth photoresist height. According to some embodiments, the method of forming a semiconductor arrangement comprises removing a first dummy material of the first dummy gate from between the first sidewall spacer and the second sidewall spacer and forming a first gate by forming a first gate electrode between the first sidewall spacer and the second sidewall spacer, where a first gate height of the first gate is correlated to at least one of the first spacer height or the second spacer height.

According to some embodiments, a method of forming a semiconductor arrangement comprises determining a first photoresist height of a first area of a first photoresist adjacent a first dummy gate after a first photoresist etch and determining a second photoresist height of a second area of the first photoresist after the first photoresist etch. According to some embodiments, the method of forming a semiconductor arrangement comprises responsive to the first difference between the first photoresist height and the second photoresist height being less than a first threshold difference, removing the first photoresist and forming a second layer of photoresist over the first dummy gate and performing a second photoresist etch to pattern the second layer of photoresist to form a second photoresist adjacent the first dummy gate, where the second photoresist etch is different than the first photoresist etch based upon the first difference between the first photoresist height and the second photoresist height. According to some embodiments, the method of forming a semiconductor arrangement comprises determining a third photoresist height of a third area of the second photoresist adjacent the first dummy gate after the second photoresist etch and determining a fourth photoresist height of a fourth area of the second photoresist after the second photoresist etch. According to some embodiments, the method of forming a semiconductor arrangement comprises responsive to a second difference between the third photoresist height and the fourth photoresist height being less than the first threshold difference, performing a hard mask etch, where the hard mask etch removes a first hard mask of the first dummy gate, a portion of the first sidewall spacer above the second photoresist and a portion of the second sidewall spacer above the second photoresist, where a first spacer height of the first sidewall spacer is correlated to a mean of the third photoresist height and the fourth photoresist height and a second spacer height of the second sidewall spacer is correlated to the mean of the third photoresist height and the fourth photoresist height. According to some embodiments, the method of forming a semiconductor arrangement comprises removing a first dummy material of the first dummy gate from between the first sidewall spacer and the second sidewall spacer and forming the first gate by forming the first gate electrode between the first sidewall spacer and the second sidewall spacer, where the first gate height of the first gate is correlated to at least one of the first spacer height or the second spacer height.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement, comprising:
    forming a first photoresist surrounding sidewalls and a top surface of a dummy gate;
    measuring a height of the first photoresist at a plurality of locations;
    computing a mean value for the height of the first photoresist based upon measurements of the height of the first photoresist at the plurality of locations; and
    responsive to the mean value deviating from a target height by more than a first threshold:
        removing the first photoresist; and
        forming a second photoresist surrounding the sidewalls and the top surface of the dummy gate.

2. The method of claim 1, comprising:
    responsive to a first measurement of the measurements deviating from a second measurement of the measurements by more than a second threshold:
        removing the first photoresist; and
        forming a second photoresist surrounding the sidewalls and the top surface of the dummy gate.

3. The method of claim 2, comprising:
    responsive to the mean value not deviating from the target height by more than the first threshold and responsive to the measurements not deviating by more than the second threshold:
        etching the first photoresist to expose the top surface of the dummy gate and a portion of the sidewalls.

4. The method of claim 3, comprising:
    measuring the height of the first photoresist at a first location to derive a first photoresist height and a second location to derive a second photoresist height after exposing the top surface of the dummy gate and a portion of the sidewalls of the dummy gate;
    comparing the first photoresist height to the second photoresist height; and
    responsive to a difference between the first photoresist height and the second photoresist height not exceeding a third threshold:
        performing a hard mask etch to remove a hard mask of the dummy gate and the portion of the sidewalls that are exposed.

5. The method of claim 4, comprising, after the performing a hard mask etch:
    removing the first photoresist; and
    replacing a dummy material of the dummy gate with a gate electrode.

6. The method of claim 4, comprising:
    responsive to the difference between the first photoresist height and the second photoresist height exceeding the third threshold:
        removing the first photoresist; and
        forming a second photoresist surrounding the sidewalls and the top surface of the dummy gate.

7. The method of claim 1, comprising:
    responsive to the mean value not deviating from the target height by more than the first threshold:
        etching the first photoresist to expose the top surface of the dummy gate and a portion of the sidewalls.

8. The method of claim 7, comprising:
    measuring the height of the first photoresist at a first location to derive a first photoresist height and a second location to derive a second photoresist height after exposing the top surface of the dummy gate and a portion of the sidewalls of the dummy gate;
    comparing the first photoresist height to the second photoresist height; and
    responsive to a difference between the first photoresist height and the second photoresist height not exceeding a third threshold:
        performing a hard mask etch to remove a hard mask of the dummy gate and the portion of the sidewalls that are exposed.

9. The method of claim 8, comprising, after the performing a hard mask etch:
    removing the first photoresist; and
    replacing a dummy material of the dummy gate with a gate electrode.

10. The method of claim 8, comprising:
    responsive to the difference between the first photoresist height and the second photoresist height exceeding the third threshold:
        removing the first photoresist; and
        forming a second photoresist surrounding the sidewalls and the top surface of the dummy gate.

11. The method of claim 10, wherein:
    the forming a first photoresist comprises performing a first photoresist etch,
    the forming a first photoresist comprises performing a second photoresist etch, and
    a parameter of an etch process is changed between the first photoresist etch and the second photoresist etch based upon the difference between the first photoresist height and the second photoresist height.

12. The method of claim 1, the measuring comprising:
    performing optical critical dimension (OCD) spectroscopy at the plurality of locations.

13. A method of forming a semiconductor arrangement, comprising:

determining a first photoresist height of a first area of a first photoresist adjacent a dummy gate after a first photoresist etch;

determining a second photoresist height of a second area of the first photoresist after the first photoresist etch; and responsive to a difference between the first photoresist height and the second photoresist height being greater than a threshold difference:

removing the first photoresist and forming a second photoresist over the dummy gate; and performing a second photoresist etch to pattern the second photoresist, wherein the second photoresist etch is different than the first photoresist etch based upon the difference between the first photoresist height and the second photoresist height.

14. The method of claim 13, wherein at least one of:

the determining a first photoresist height comprises performing optical critical dimension (OCD) spectroscopy; or the determining a second photoresist height comprises performing OCD spectroscopy.

15. The method of claim 13, wherein at least one of:

the determining a first photoresist height comprises generating a three-dimensional (3D) model of the first area of the first photoresist using primary optical critical dimension (OCD) spectroscopy data; or the determining a second photoresist height comprises generating a 3D model of the second area of the first photoresist using primary OCD spectroscopy data.

16. The method of claim 13, wherein the performing a second photoresist etch comprises:

adjusting at least one of a temperature, a pressure, a chemistry, a concentration, or a duration of the second photoresist etch relative to the first photoresist etch.

17. A method of forming a semiconductor arrangement, comprising:

determining a first photoresist height of a first area of a first photoresist adjacent a dummy gate after a first photoresist etch;

determining a second photoresist height of a second area of the first photoresist after the first photoresist etch; and responsive to a difference between the first photoresist height and the second photoresist height being less than a threshold difference:

performing a hard mask etch to remove a hard mask of the dummy gate, a portion of a first sidewall spacer above the first photoresist, and a portion of a second sidewall spacer above the first photoresist, wherein:

a first spacer height of the first sidewall spacer is correlated to a mean of the first photoresist height and the second photoresist height, and a second spacer height of the second sidewall spacer is correlated to the mean of the first photoresist height and the second photoresist height.

18. The method of claim 17, wherein at least one of:

the determining a first photoresist height comprises performing optical critical dimension (OCD) spectroscopy, or the determining a second photoresist height comprises performing optical critical dimension (OCD) spectroscopy.

19. The method of claim 17, wherein at least one of:

the determining a first photoresist height comprises generating a three-dimensional (3D) model of the first area of the first photoresist using primary optical critical dimension (OCD) spectroscopy data, or the determining a second photoresist height comprises generating a three-dimensional (3D) model of the second area of the first photoresist using primary optical critical dimension (OCD) spectroscopy data.

20. The method of claim 17, comprising responsive to the difference between the first photoresist height and the second photoresist height being greater than the threshold difference:

removing the first photoresist;

forming a second photoresist over the dummy gate;

performing a second photoresist etch to pattern the second photoresist, wherein the second photoresist etch is different than the first photoresist etch based upon the difference between the first photoresist height and the second photoresist height;

determining a third photoresist height of a third area of the second photoresist adjacent the dummy gate after the second photoresist etch;

determining a fourth photoresist height of a fourth area of the second photoresist after the second photoresist etch; and responsive to a difference between the third photoresist height and the fourth photoresist height being less than the threshold difference:

performing the hard mask etch to remove the hard mask of the dummy gate, a portion of the first sidewall spacer above the second photoresist, and a portion of the second sidewall spacer above the second photoresist, wherein:

the first spacer height of the first sidewall spacer is correlated to a mean of the third photoresist height and the fourth photoresist height, and the second spacer height of the second sidewall spacer is correlated to the mean of the third photoresist height and the fourth photoresist height.

* * * * *